United States Patent [19]

Landolf

[11] Patent Number: 5,788,855
[45] Date of Patent: Aug. 4, 1998

US005788855A

[54] METHOD OF PRODUCING CIRCUIT BOARD

[75] Inventor: David Landolf, Beaverton, Oreg.

[73] Assignee: Intel Corporation, Santa Clara, Calif.

[21] Appl. No.: 880,577

[22] Filed: Jun. 23, 1997

Related U.S. Application Data

[62] Division of Ser. No. 434,521, May 4, 1995, abandoned.

[51] Int. Cl.$^6$ .................................................. B44C 1/22
[52] U.S. Cl. ............................ 216/13; 216/16; 216/84
[58] Field of Search ................................. 216/13, 18, 19, 216/20, 21, 78, 105, 59, 84

[56] References Cited

U.S. PATENT DOCUMENTS

| | | | |
|---|---|---|---|
| 4,089,734 | 5/1978 | Bierig | 216/16 X |
| 4,213,082 | 7/1980 | Wisner et al. | 323/17 |
| 4,686,616 | 8/1987 | Williamson | 363/21 |
| 4,703,436 | 10/1987 | Varshney | 257/529 |
| 4,897,047 | 1/1990 | Connell et al. | 439/189 |
| 5,022,955 | 6/1991 | Chen | 216/21 |
| 5,051,615 | 9/1991 | Rosenthal | 307/350 |
| 5,063,660 | 11/1991 | Fiedelius | 216/105 X |
| 5,321,322 | 6/1994 | Verheyen et al. | 307/465.1 |
| 5,389,814 | 2/1995 | Srikrishnan et al. | 257/529 |

FOREIGN PATENT DOCUMENTS

| | | |
|---|---|---|
| 60-10665 | 1/1985 | Japan . |
| 4162691 | 6/1992 | Japan | 361/765 |

*Primary Examiner*—William Powell
*Attorney, Agent, or Firm*—Blakely, Sokoloff, Taylor & Zafman

[57] ABSTRACT

A printed circuit board having a selectable circuit routing configuration comprises a substrate, a plurality of electrical traces mounted to the substrate for interconnecting electrical components, and at least one fusible connector mounted to the substrate. Each of the fusible connectors has a fuse line formed from a conductive layer of the printed circuit board and forms a fusible connection between at least two of the electrical traces. The circuit routing configuration can be selected by application of a predetermined current through at least one of the fusible connectors to break the fusible connection formed by the fusible connector.

9 Claims, 4 Drawing Sheets

METHOD OF PRODUCING CIRCUIT BOARD

This is a divisional of application Ser. No. 08/434,521 filed May 4, 1995, now abandoned.

FIELD OF THE INVENTION

The present invention pertains to the field of printed circuit boards. More particularly, the present invention relates to reconfiguring the electrical routing configuration of a printed circuit board after completion of the manufacturing process.

BACKGROUND OF THE INVENTION

Printed circuit boards are commonly used in the computer industry and in numerous other areas of technology to implement electronic circuitry. A printed circuit board typically consists of one or more substrate layers made of a dielectric material, on which electronic components are mounted. One or more layers of conductive material, such as copper, are mounted on and between the substrate layers to form the wiring, or "traces", that interconnect the electronic components. The traces may be formed by fixing a solid metal plane onto the surface of a substrate layer and then etching the metal plane according to a pattern. The traces are typically covered by an insulative protective coating, with the exception of certain portions which are left exposed for the purpose of providing bonding contacts.

Because there are so many potential uses for printed circuit boards, it has become desirable to provide the capability to mass produce a printed circuit board which has a single generic routing configuration, but which later can be tailored to have one of multiple specific configurations. Various solutions have been developed to accomplish this goal. For example, a "zero-ohm" resistor, or jumper, can be used to electrically connect two traces on a printed circuit board to modify the routing configuration. This solution is disadvantageous, however, because it is not cost effective to purchase and maintain an inventory of separate components for this purpose. One way to overcome this disadvantage is to use solder instead of a zero-ohm resistor to connect two traces and thereby modify the routing configuration. There are many situations, however, in which it may be desirable to adjust the routing configuration of a printed circuit board during the post-manufacturing test phase. Yet both of the above-mentioned solutions may be impractical to implement once the manufacturing process has been completed.

One situation in which the post-manufacture configuration of a printed circuit board may be desirable is the production of personal computer (PC) motherboards. A PC motherboard, which contains the central processing unit (CPU) of the computer, may also contain a dedicated power supply for the CPU. The CPU requires a regulated power supply which will provide a very precise voltage; often a tolerance of less than 1% is required. However, power supply voltages tend to vary depending upon load, temperature, noise, and manufacturing tolerances. Consequently, the "set point" of the regulated power supply must be carefully adjusted. The "set point" is the regulated output voltage at a steady load and temperature. Typically, the output voltage of a power supply is measured during testing. Power is then removed, and the set point is adjusted according to the measured output voltage.

One way to permit the adjustment of the set point is to provide a feedback circuit comprising a resistor divider network, as illustrated in FIG. 1. FIG. 1 is a block diagram of a regulated power supply 1 having a feedback circuit 20 comprising a simple resistor divider network which is well-known in the prior art. The resistor divider network consists of a resistor RX having a fixed value and a variable resistor RY. The value of resistor RY is varied manually to adjust the output $V_{FB}$ of the divider network to adjust the set point of the power supply. This solution is disadvantageous, however, because the resistor RY requires mechanical adjustment, and because its value may tend to drift once the motherboard is installed and operating in a PC.

Therefore, it is desirable to provide for the mass production of a printed circuit board having a single routing configuration which can be easily reconfigured to have one of multiple different routing configurations. It is also desirable to make reconfiguration practical and convenient even if performed after the manufacturing process has been completed. It is further desirable to provide a means for configuring the trace routing on a printed circuit board such that a separate inventory of parts need not be maintained for that purpose. In addition, it is desirable to provide a regulated power supply which has a set point that is adjustable during post-manufacture testing and which incorporates the aforementioned features.

SUMMARY OF THE INVENTION

A printed circuit board having a selectable circuit routing configuration is described. The printed circuit board comprises a substrate, a plurality of electrical traces mounted to the substrate for interconnecting electrical components, and at least one fusible connector mounted to the substrate. Each of the fusible connectors comprises a fuse line formed from a conductive layer of the printed circuit board and forms a fusible connection between at least two of the electrical traces. The circuit routing configuration is selectable by application of a predetermined current through at least one of the fusible connectors to break the fusible connection formed by the fusible connector.

The fusible signal connector comprises a first contact pad located at an end of a first signal trace on a printed circuit board, a second contact pad located at an end of a second signal trace on the printed circuit board, and a fuse line. The fuse line is formed from the conductive layer of the printed circuit board and is fusibly coupled between the first contact pad and the second contact pad. The predetermined current driven through the fuse line causes the fuse line to fuse open.

Other features of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A printed circuit board having a selectable circuit routing configuration is described. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form in order to avoid unnecessarily obscuring the present invention.

Figure 1:
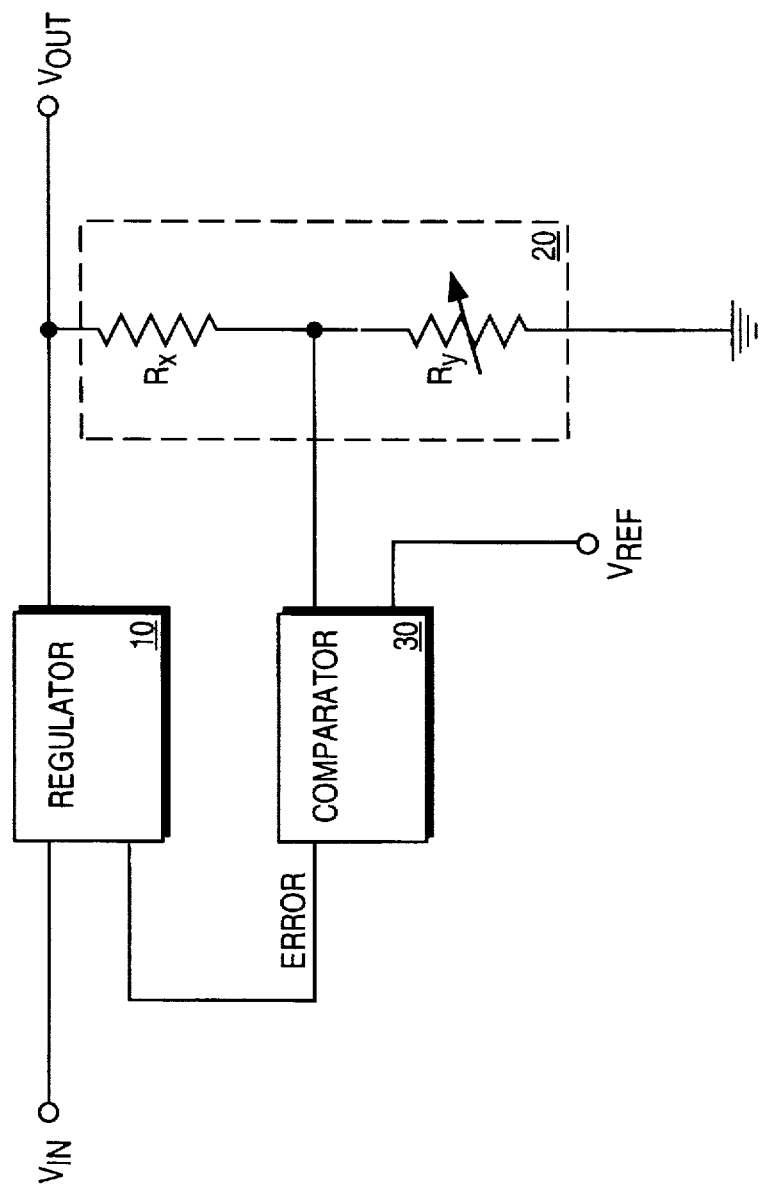
FIG. 1 is a block diagram of a regulated power supply having a resistor divider network according to the prior art.
Figure 2:
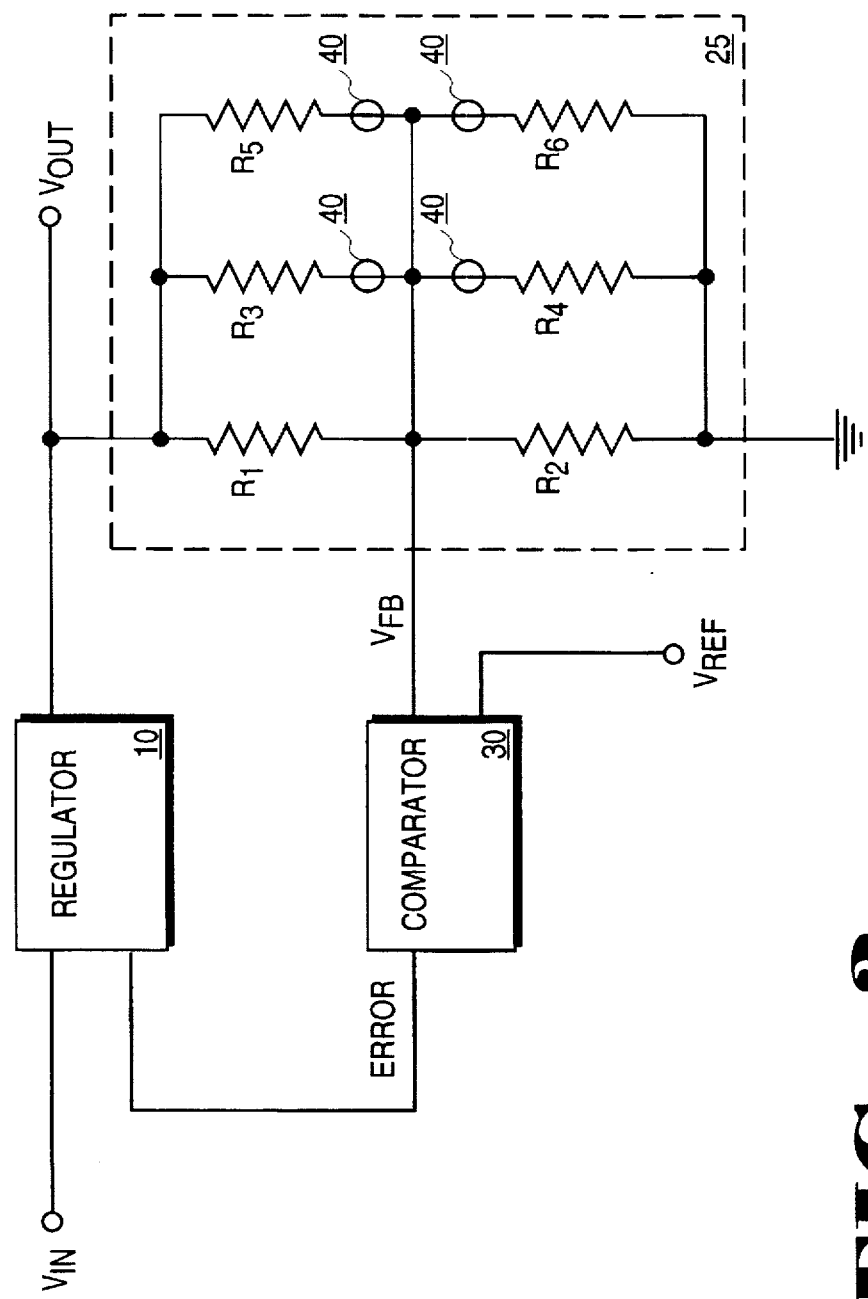
FIG. 2 is a block of a regulated power supply having a resistor divider network with fusible connectors.

FIG. 2 shows a regulated power supply 2. The regulated power supply 2 consists of a regulator 10 which receives an input voltage $V_{IN}$ and which generates an output voltage $V_{OUT}$. The output voltage is input to a feedback circuit consisting of a resistor divider network 25. The resistor divider network 25 outputs a feedback voltage $V_{FB}$ to a comparator 30. The comparator receives the feedback voltage $V_{FB}$ and a reference voltage $V_{REF}$ and outputs to the regulator 10 an error voltage ERROR which is proportional to the difference between the feedback voltage $V_{FB}$ and the reference voltage $V_{REF}$. The functions performed by the combination of the comparator 30 and the reference voltage $V_{REF}$ may be implemented using well-known integrated circuits, such as the TL1431 or the TL431.

The resistor divider network 25 consists of six resistors R1 through R6. Set Point resistor R1 is coupled between the output $V_{OUT}$ of the regulator 10 and the $V_{FB}$ input of the comparator 30. Set Point resistor R2 is coupled between the $V_{FB}$ input of the comparator 30 and ground. Resistors R3 and R5 are coupled in parallel with Set Point resistor R1, while resistors R4 and R6 are coupled in parallel with Set Point resistor R2. Each of resistors R3 through R6 is coupled to the $V_{FB}$ input of the comparator 30 through a separate one of four fusible resistors 40.

The regulated power supply 2 has a set point which represents the output voltage $V_{OUT}$ at a constant load and temperature. The set point may be adjusted by adjusting the feedback voltage $V_{FB}$ input to the comparator 30 for a given output voltage $V_{OUT}$. In other words, the set point may be adjusted by changing the transfer function $V_{FB}/V_{OUT}$ of the resistor divider network. This is accomplished by breaking the current path through one or more of resistors R3 through R6. Consequently, the set point of the regulated power supply 2 may be adjusted by selectively fusing open one or more of the fusible connectors 40.

Figure 3:
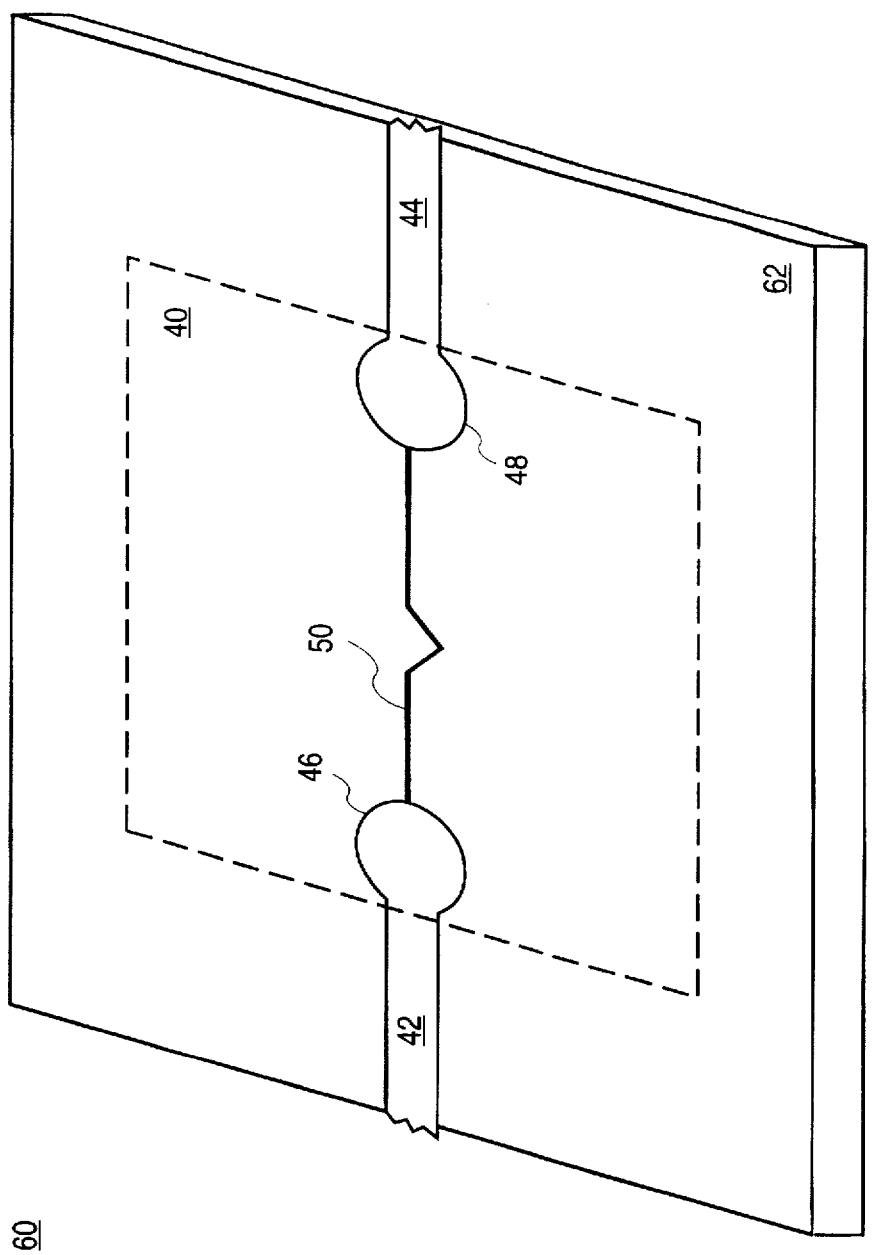
FIG. 3 illustrates a fusible connector according to one embodiment of the present invention.

Referring now to FIG. 3, a section 60 of a printed circuit board is shown. The printed circuit board consists of a substrate 62 and multiple copper traces, including traces 42 and 44. Traces 42 and 44 are terminated in copper contact pads 46 and 48, respectively. Coupled between contact pads 46 and 48 is a fuse line 50. A fusible connector 40 comprises the contact pads 46 and 48 and the fuse line 50. In the preferred embodiment, the contact pads 46 and 48, the fuse line 50, and the traces 42 and 44 are all formed simultaneously from a single copper layer by the same etching process. Although the traces on the printed circuit board 60 are generally covered by a protective layer of insulating material, the contact pads 46 and 48 are exposed to allow electrical contact with a test probe or other similar instrument.

The fuse line 50 may be fused open by applying a predetermined voltage between contact pads 46 and 48 to cause a fusing current to flow through the fuse line 50. The width and shape of the fuse line 50 are calculated such that the fuse line 50 will fuse open at the lowest possible fusing current and provide the cleanest break upon fusing, subject to current manufacturing capabilities. A fuse line 50 having a kinked shape as shown in FIG. 3 may be suitable for this purpose. In addition, the length of the fuse line 50 is as short as possible according to current manufacturing capabilities. The contact pads 46 and 48 and fuse line 50 are sized and shaped in order to provide negligible resistance.

Figure 4:
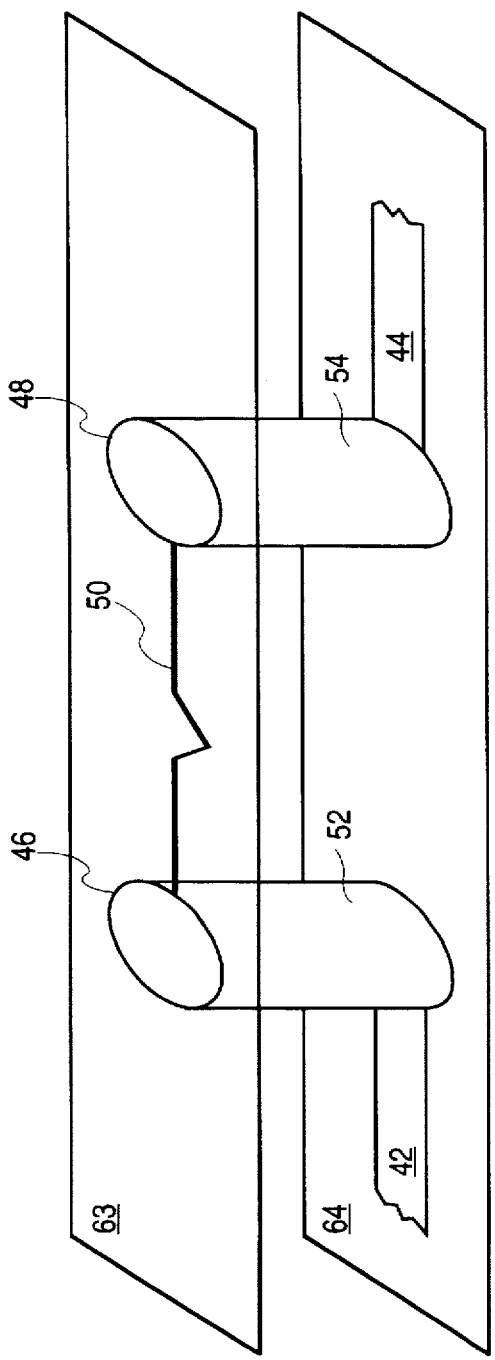
FIG. 4 illustrates a fusible connector implemented on multiple layers of a printed circuit board.

The present invention may also be embodied on a multiple layer printed circuit board, as shown in FIG. 4. The fuse line 50 is formed on one substrate layer 63 of the printed circuit board while the traces 42 and 44 are formed on a different substrate layer 64. Connection between the fuse line 50 and contact pads 46 and 48 is made through vias 52 and 54.

Hence, the routing configuration of the printed circuit board 60 can be easily altered after the manufacturing process has been completed (e.g., during the testing phase) by selectively fusing open any of the fusible connectors 40. By applying a predetermined voltage between contact pad 46 and contact pad 48 to cause a predetermined current to pass through and to fuse open the fuse line 50. Furthermore, if this process is performed during the testing phase, the open/short condition of the fusible connector 40 can be easily tested, since the printed circuit board is already connected to the test equipment. Therefore, the printed circuit board 60 can be mass produced to have a single routing configuration that can be easily reconfigured into one of multiple different routing configurations. It is not necessary to maintain a separate inventory of parts for the purpose of performing such reconfiguration. Furthermore, the fusible connector 40 can be implemented in a regulated power supply such that the set point of the power supply can be easily adjusted during testing without the need for mechanical adjustment of a variable resistor, and such that the set point has minimal variance during operation.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method of providing a circuit board having a selectable circuit routing configuration, the method comprising:
   forming a conductive layer on a substrate;
   forming a plurality of electrical traces from the conductive layer; and
   forming a fusible connection from the conductive layer between at least two of the electrical traces simultaneously with said forming the plurality of electrical traces, such that a circuit routing configuration of the circuit board is configurable by application of a fusing current through the fusible connection to cause the fusible connection to fuse open.

2. A method according to claim 1, further comprising applying the fusing current through the fusible connection during a test phase to cause the fusible connection to fuse open.

3. A method according to claim 1, wherein said forming the plurality of electrical traces and said forming the fusible connection are performed substantially simultaneously by etching the conductive layer.

4. A method of producing a circuit board, the circuit board having a circuit routing configuration, the method comprising:
   forming a plurality of electrical traces and a fusible connection between the electrical traces from a conductive layer of the circuit board; and
   verifying the routing configuration of the circuit board as part of a test phase; and configuring the circuit routing configuration of the circuit board as part of the test phase by applying a current through the fusible connection to fuse open the fusible connection.

5. A method according to claim 4, wherein said forming the plurality of traces and the fusible connection comprises forming the plurality of traces and the fusible connection from the conductive layer concurrently by etching the conductive layer.

6. A method of producing a circuit board, the circuit board having a circuit routing configuration, the method comprising:

forming a conductive layer on a substrate;

forming a plurality of electrical traces from the conductive layer; and forming a fusible connection from the conductive layer between at least two of the electrical traces;

testing the routing configuration of the circuit board during a test phase; and configuring the circuit routing configuration of the circuit board during the test phase by applying a current through the fusible connection to fuse open the fusible connection.

7. A method according to claim 6, wherein said forming the plurality of electrical traces and said forming the fusible connection are performed concurrently by etching the conductive layer.

8. A method of providing a circuit board having a selectable circuit routing configuration, the method comprising:

forming a conductive layer on a substrate;

forming a plurality of electrical traces from the conductive layer; and forming a fusible connection from the conductive layer between at least two of the electrical traces;

connecting the circuit board to test equipment; and using the test equipment to apply a fusing current through the fusible connection to cause the fusible connection to fuse open; and using the test equipment to verify the routing configuration of the circuit board without removing the circuit board from the test equipment.

9. A method according to claim 8, wherein said forming the plurality of electrical traces and said forming the fusible connection are performed concurrently by etching the conductive layer.

* * * * *